United States Patent
Petitbon et al.

(10) Patent No.: US 6,960,278 B2
(45) Date of Patent: Nov. 1, 2005

(54) METHOD OF IMPROVING THE PROPERTIES OF ADHESION OF A NON-OXIDE CERAMIC SUBSTRATE BEFORE GLUING IT

(75) Inventors: Alain Petitbon, Pau (FR); Jérôme Evieux, Tarbes (FR); Yves Baziard, Tarbes (FR)

(73) Assignee: Alstom, Paris (FR)

( * ) Notice: Subject to any disclaimer, the term of this patent is extended or adjusted under 35 U.S.C. 154(b) by 212 days.

(21) Appl. No.: 10/234,255

(22) Filed: Sep. 5, 2002

(65) Prior Publication Data

US 2003/0056892 A1 Mar. 27, 2003

(30) Foreign Application Priority Data

Sep. 21, 2001 (FR) .................. 01 12185

(51) Int. Cl.[7] .................. B05D 3/00
(52) U.S. Cl. .................. 156/272.8; 156/273.3; 427/554; 427/596
(58) Field of Search .................. 156/272.2, 272.8, 156/273.3; 427/532, 533, 554, 596

(56) References Cited

U.S. PATENT DOCUMENTS 5,473,137 A 12/1995 Queriaud et al.
6,268,522 B1 * 7/2001 Hagemeyer et al. ........ 560/245

FOREIGN PATENT DOCUMENTS

| DE | 198 60 135 A1 | 6/2000 | |
| JP | 06090083 A * | 3/1994 | ............ H05K 3/38 |
| WO | WO 98 03600 A | 1/1998 | |

\* cited by examiner

Primary Examiner—John T. Haran
(74) Attorney, Agent, or Firm—Sughrue Mion, PLLC

(57) ABSTRACT

A method of improving the properties of adhesion of a non-oxide ceramic substrate before gluing it includes the steps of irradiating the surface of the ceramic substrate using an excimer laser and applying a coupling agent to the irradiated surface.

10 Claims, 3 Drawing Sheets

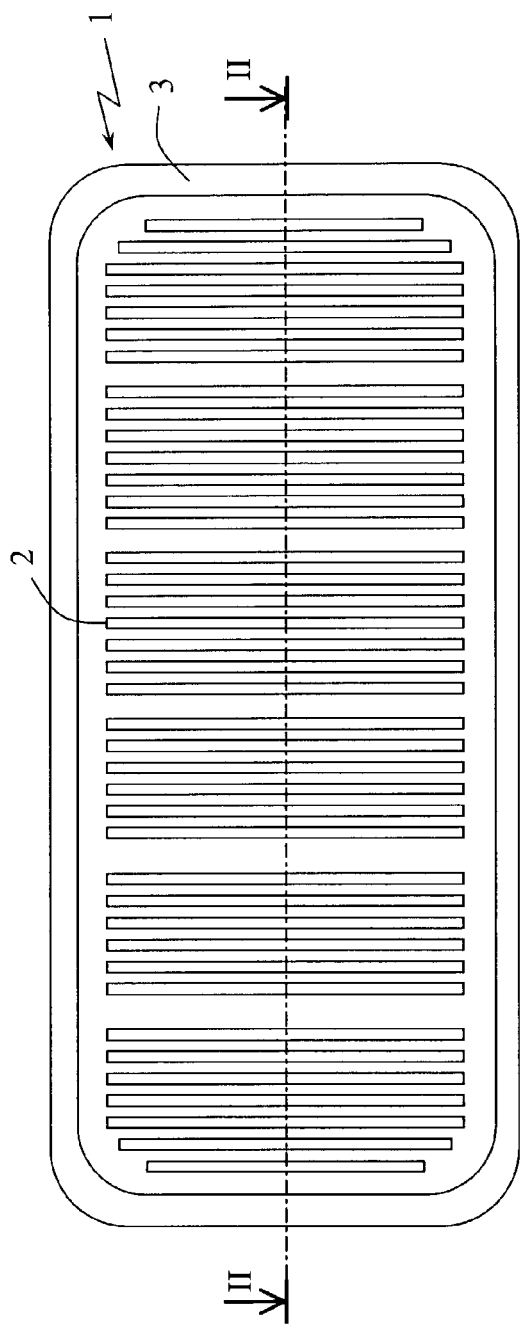
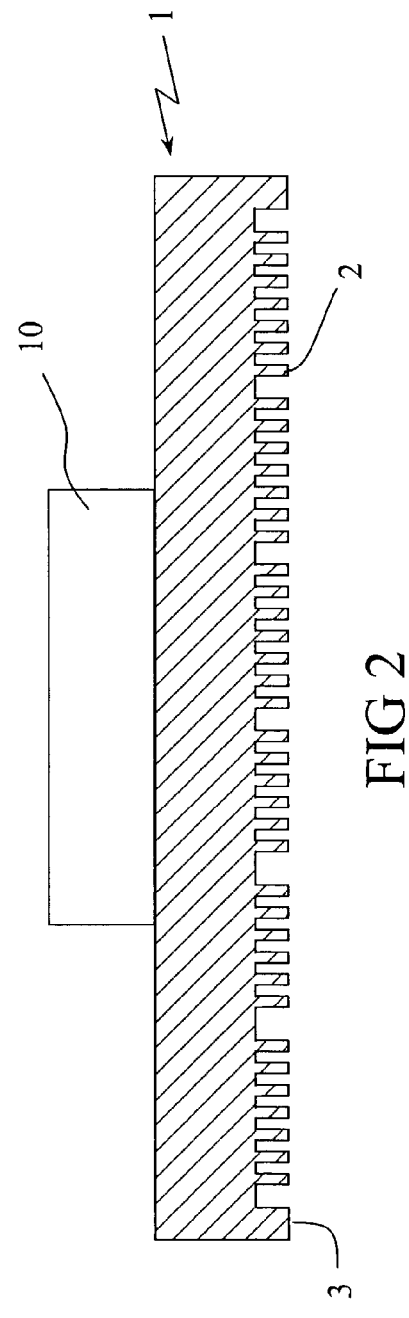
FIG 1
FIG 2

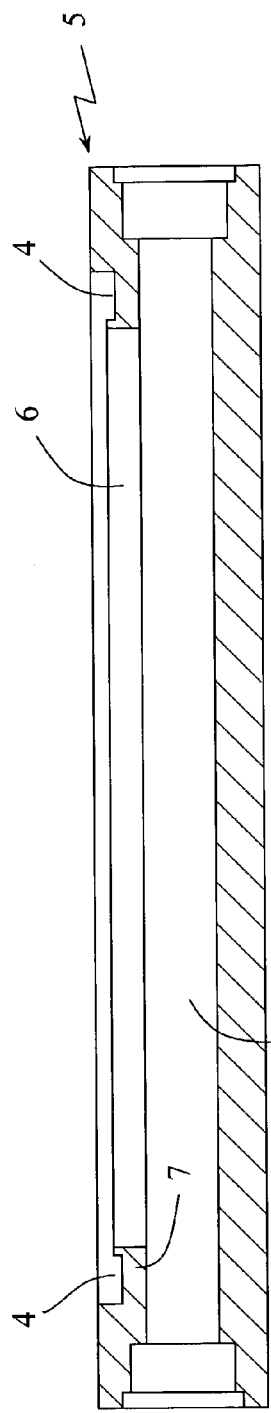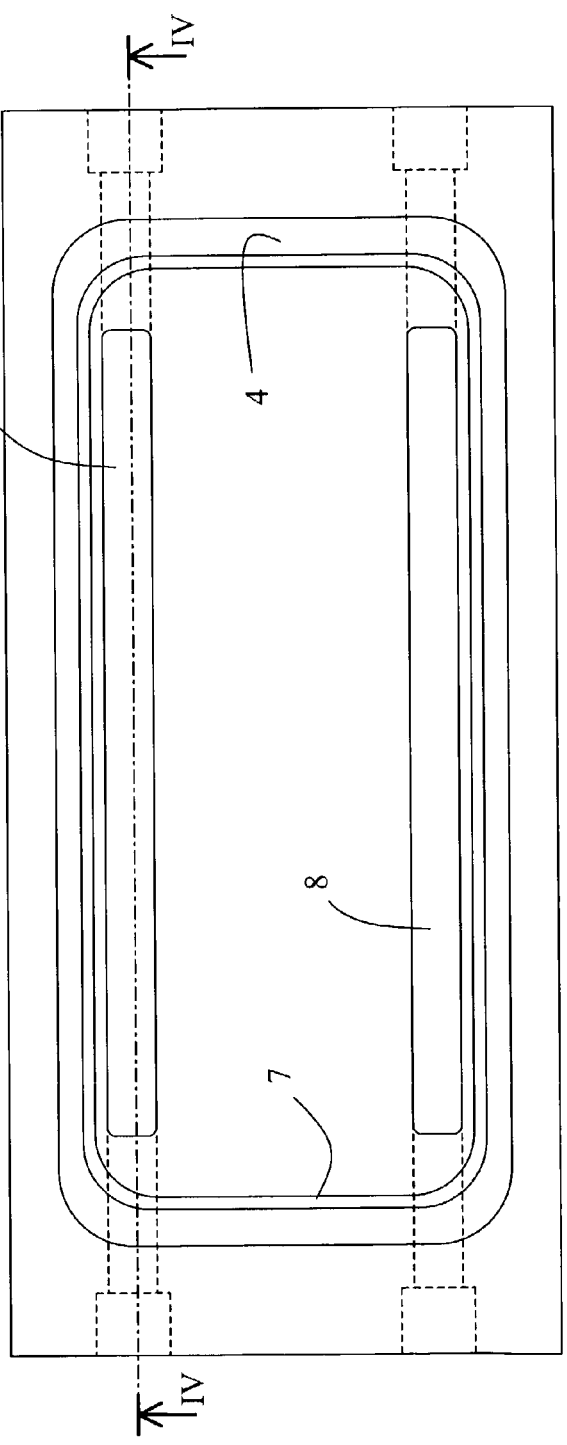
FIG 4
FIG 3

METHOD OF IMPROVING THE PROPERTIES OF ADHESION OF A NON-OXIDE CERAMIC SUBSTRATE BEFORE GLUING IT

BACKGROUND OF THE INVENTION

1. Field of the Invention

The invention relates to a method of improving the adhesion properties of a non-oxide ceramic substrate before gluing it. The method according to the invention applies in particular to preparing ceramic substrates that support power semiconductor components and are to be glued to a cooling manifold to be used in inverters used in the railroad art.

2. Description of the Prior Art

Gluing an aluminum nitride (AlN) substrate supporting power components to a cooling manifold is known in the inverter art and usually includes a step of preparing the surfaces to be glued by cleaning the surfaces using chemical, mechanical or thermal methods. For the most recent assembly methods, the surfaces are cleaned by a method using a cold plasma consisting of a mixture of argon and oxygen. This method, which can be used in a white room environment, nevertheless has the disadvantage of necessitating a vacuum enclosure, which makes it time-consuming and complicated.

Also, the cleaning methods used until now generally pollute the power components that are placed on the ceramic substrate and the glued ceramic/polymer bonds obtained are very weak from the chemical point of view, moisture migrating easily at the interfaces, especially as the chemically or mechanically cleaned surfaces, which were inherently hydrophobic before treatment, become hydrophilic after treatment. As a result of this the glued joints obtained are not reliable in a hot and moist environment, as encountered by inverters in the railroad art.

Also, one object of the present invention is to propose a method of improving the adhesion properties of a non-oxide ceramic substrate before gluing it in order to ensure high-strength glued joints and high reliability in time, without polluting any power components present on the substrate, which method is simple and economic to put into practice.

SUMMARY OF THE INVENTION

To this end, the invention provides a method of improving the properties of adhesion of a non-oxide ceramic substrate before gluing it, characterized in that it includes the following steps:
  irradiating the surface of the ceramic substrate to be glued using an excimer laser, and
  applying a coupling agent to the irradiated surface.

Particular embodiments of the method in accordance with the invention for improving the adhesion properties of a non-oxide ceramic substrate can have one or more of the following features, separately or in all technically feasible combinations:
  the energy density supplied by the excimer laser is from 0.5 to 2 J/cm$^2$ at a frequency from 1 to 100 Hz,
  the laser is a KrF excimer laser emitting at 248 nm,
  the laser is an ArF excimer laser emitting at 193 nm,
  the substrate is made of AlN, SiC or $Si_3N_4$, and
  the coupling agent is an aqueous silane solution.

The invention also provides a method of assembly by gluing a non-oxide ceramic substrate to a cooling liquid manifold using a modified epoxy resin, characterized in that it includes a step of treating the surface of the substrate to be glued by the method previously described before gluing the substrate to the manifold.

According to another feature of the assembly method by gluing in accordance with the invention, the cooling liquid manifold is made of polyetherimide.

The invention further provides a power module including a power semiconductor component disposed on a face of a non-oxide substrate, the opposite face of said substrate resting on a plastics material manifold conducting a cooling liquid over said substrate, characterized in that said collector is glued to said substrate using the method previously described.

The objects, aspects and advantages of the present invention will be better understood from the description given hereinafter of one particular embodiment of the invention, which is described by way of non-limiting example and with reference to the accompanying drawings.

BRIEF DESCRIPTION OF THE DRAWINGS

FIG. 1 is a bottom view of a substrate which can be glued to a water manifold by the method according to the invention.

FIG. 2 is a view of the manifold shown in section taken along the line II—II in FIG. 1.

FIG. 3 is a top view of a water manifold which can be glued to the substrate shown in FIG. 1.

FIG. 4 is a view of the manifold in section taken along the line IV—IV in FIG. 3.

DETAILED DESCRIPTION OF THE PREFERRED EMBODIMENT

Figure 5:
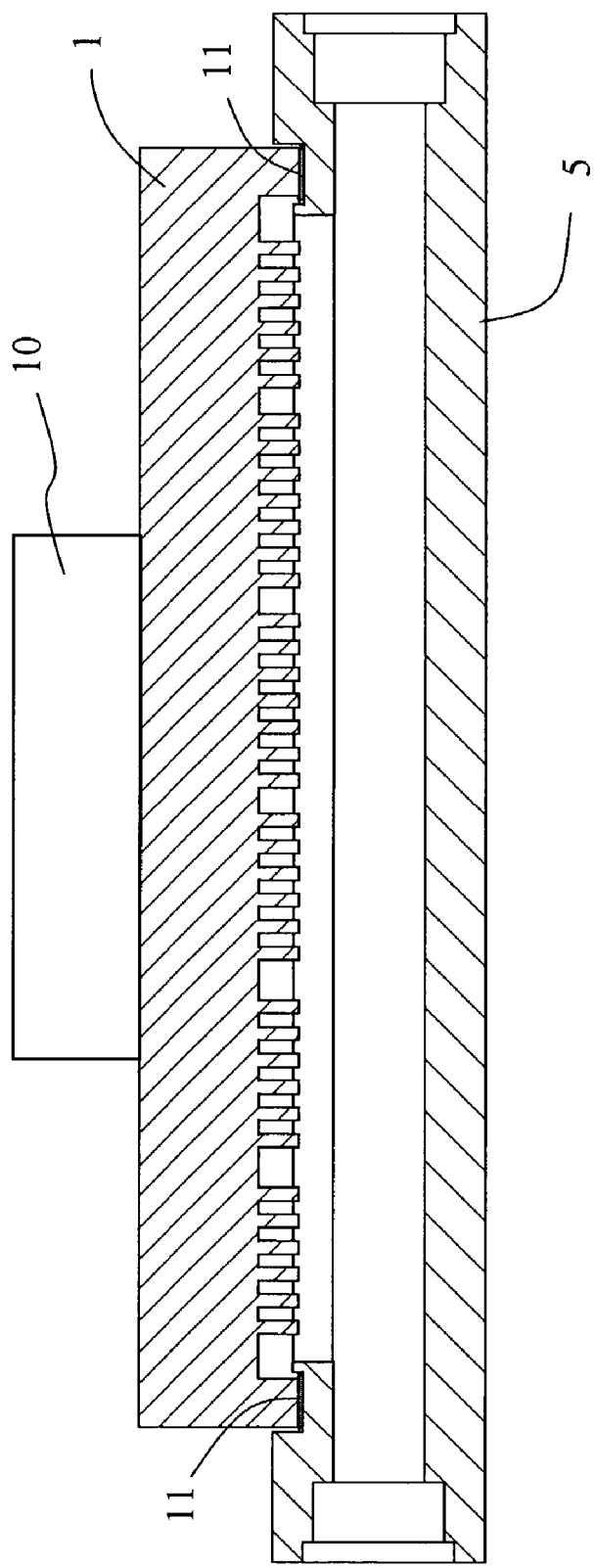
FIG. 5 is a sectional view showing the FIG. 1 substrate assembled to the FIG. 3 manifold.

To simplify the drawings, only components necessary to understanding the invention are shown. The same components carry the same reference numbers from one figure to another.

FIGS. 1 and 2 show an aluminum nitride (AlN) substrate 1 having a bottom face provided with cooling fins 2 and a plane top face receiving a power semiconductor component 10. As shown in these figures, the periphery of the bottom face of the substrate has a downwardly projecting rim 3 adapted to be glued to a polyetherimide water manifold 5 shown in FIGS. 3 and 4.

As shown in FIGS. 3 and 4, the water manifold 5 has in its top part an opening 6 bordered by a rim 7 with a groove 4 having a shape complementary to that of the rim 3 of the substrate 1. The bottom part of the opening 6 is closed by a wall with localized slots 8 opening into passages 9 which extend longitudinally inside the body of the manifold 5 and are fed with cooling water from their ends.

The method of improving the adhesion properties of the substrate 1 before gluing it to the water manifold 5 is explained next.

The surface of the rim 3 of the AlN substrate 1 is treated locally using a KrF excimer laser emitting ultraviolet radiation at 248 nm. In a differ embodiment, the local treatment uses an ArF excimer laser emitting at 193 nm.

The surface treatment conditions are as follows: a power from 0.5 to 2 J/cm$^2$, preferably from 0.6 to 1 J/cm$^2$, a firing frequency of 1 to 100 Hz, preferably from 5 to 20 Hz, number of firings from 1 to 100.

The surface treatment breaks the Al—N chemical bonds and obtains locally a decomposed aluminum nitride. The resulting more or less oxidized aluminum then readily forms a chemical bond with a coupling agent such as an aqueous silane solution. The coupling agent is applied to the rim 3 simply by dipping the rim 3 of the substrate 1 into a bath of silane, for example.

Preferred silanes for improving the resistance to aging of the ceramic/polymer joint in a wet environment (water containing glycol, water) are γ-glycidoxypropyl-trimethoxysilane (γ-GPS), which has the chemical formula $CH_2$—O—$(CH_2)_3Si$ $(OCH_3)_3$, and γ-aminopropyltriethoxysilane (γ-APS), which has the chemical formula $NH_2$—$(CH_2)_3Si$ $(OC_2H_5)_3$.

The silane on the rim 3 of the AlN substrate 1 is then polymerized.

The substrate 1 can then be glued to the manifold 5 in the conventional way, using a modified epoxy resin 11 at the interface between the rim 3 and the groove 4, as shown in FIG. 5.

The silane is preferably applied to the rim as quickly as possible after irradiating the surface, and gluing by means of the modified epoxy resin is preferably carried out within two days of polymerizing the silane. Also, parts treated by the method in accordance with the invention of improving their adhesion properties are preferably stored in a controlled atmosphere.

The method of improving the adhesion properties of the rim 3 of the AlN substrate 1 can consist of the following steps, for example:

- surface treatment by irradiation using a KrF laser at 1 $J/cm^2$, 10 Hz and 50 firings,
- application to the irradiated rim 3 of a 0.5% concentration solution of γ-GPS, and
- polymerization of the γ-GPS solution deposited on the rim 3 at 110° C. for 15 minutes.

Trials of the above treatment of the AlN substrate have shown that the durability of the glued joint between the substrate 1 and the manifold 5 is increased by a factor from 4 to 16, depending on the kind of epoxy resin used.

The above kind of method in accordance with the invention for improving adhesion properties obtains a durable and reliable glued joint having strong chemical bonds. The silane forms with the mineral substrate oxidized by the excimer laser siloxane-type covalent bonds that are much less sensitive to water than the bonds that appear when a polymer is brought into contact with the same substrate. It is therefore possible to retard the penetration of moisture at the interfaces and therefore to increase the service life of the assembly, especially in a hot and wet environment.

The method in accordance with the invention of improving adhesion properties also has the advantage of being less costly, as the excimer laser treatment, which is non-polluting, can be carried out in a white room environment with no special enclosure.

Of course, the invention is in no way limited to the embodiment described and shown, which has been provided by way of example only, and which can be modified, in particular from the point of view of the composition of the various component parts or by substituting technical equivalents, without departing from the scope of protection of the invention. Thus in different embodiments of the invention the substrate could be made of silicon carbide SiC or silicon nitride $Si_3N_4$.

What is claimed is:

1. A method of improving the properties of adhesion of a non-oxide ceramic substrate before gluing part of a surface of the substrate, which substrate has disposed on another face thereof at least one power semiconductor component prior to performing the method, which method comprises the following steps:
    irradiating the surface of said ceramic substrate to be glued using an excimer laser in order to modify the chemical bonds, and
    applying a coupling agent to the irradiated surface leading to the formation of a chemical bond between the coupling agent and the oxidized surface resulting from the irradiation of the ceramic substrate.

2. The method claimed in claim 1, wherein the energy density supplied by said excimer laser is from 0.5 to 2 $J/cm^2$ at a frequency from 1 to 100 Hz.

3. The method claimed in claim 1, wherein said laser is a KrF excimer laser emitting at 248 nm.

4. The method claimed in claim 1, wherein said laser is an ArF excimer laser emitting at 193 nm.

5. The method claimed in claim 1, wherein said substrate is made of AlN, SiC or $Si_3N_4$.

6. The method claimed in claim 1, wherein said coupling agent is an aqueous silane solution.

7. A method of assembly, comprising:
    irradiating the surface to be glued of a non-oxide ceramic substrate using an excimer laser;
    applying a coupling agent to the irradiated surface leading to the formation of a chemical bond between the coupling agent and the irradiated surface; and
    gluing the ceramic substrate to a cooling liquid manifold by applying a modified epoxy resin to an interface of the coupling agent-covered surface of the ceramic substrate and the cooling manifold.

8. The method claimed in claim 7, wherein said cooling liquid manifold is made of polyetherimide.

9. A method of improving the properties of adhesion of a non-oxide ceramic substrate before gluing said substrate, which method comprises the following steps:
    irradiating the surface of said ceramic substrate to be glued using an excimer laser in order to modify the chemical bonds; and
    applying a coupling agent to the irradiated surface leading to the formation of a chemical bond between the coupling agent and the oxidized surface resulting from the irradiation of the ceramic substrate;
    wherein said coupling agent is an aqueous silane solution.

10. A method of improving the properties of adhesion of a non-oxide ceramic substrate before gluing said substrate, which method comprises the following steps:
    irradiating the surface of said ceramic substrate to be glued using an excimer laser in order to modify the chemical bonds;
    applying a coupling agent to the irradiated surface leading to the formation of a chemical bond between the coupling agent and the oxidized surface resulting from the irradiation of the ceramic substrate; and
    applying a glue to part of the coupling agent-covered surface.

* * * * *